United States Patent [19]

Cherry

[11] 4,130,799

[45] Dec. 19, 1978

[54] METHOD AND APPARATUS FOR CONTINUOUS FREQUENCY MEASUREMENT

[76] Inventor: Harvey A. Cherry, 1226 Ferndale Dr., Seabrook, Tex. 77586

[21] Appl. No.: 813,170

[22] Filed: Jul. 5, 1977

[51] Int. Cl.$^2$ .......................................... G01R 23/14
[52] U.S. Cl. .............................. 324/79 D; 328/133
[58] Field of Search .............. 328/105, 133, 134, 140, 328/141; 324/77 D, 78 D, 79 D, 140 D

[56] References Cited

U.S. PATENT DOCUMENTS

| | | | |
|---|---|---|---|
| 3,911,253 | 10/1975 | Torresdal | 324/79 D |
| 3,997,740 | 12/1976 | Eubank | 324/79 D |

*Primary Examiner*—M. Tokar
*Attorney, Agent, or Firm*—Bard & Groves

[57] ABSTRACT

A method for providing a continuous binary coded output measurement of an unknown input frequency or pulse rate. The unknown pulse rate is compared against a first known frequency and an output is obtained in binary coded form which is functionally related to the approximate ratio of the unknown pulse rate to the known pulse rate. A second unknown pulse rate equal to the difference between the unknown pulse rate and the ratio times the known pulse rate is generated. The unknown input pulse rate or the second unknown pulse rate is then transferred to a second stage when the ratio is less than one or greater than one respectively. A series of such comparisons are made to obtain an approximate value for the unknown pulse rate to a predetermined resolution.

Apparatus is provided for receiving and continuously providing an output measurement for an unknown input frequency. A clock circuit provides a plurality of known frequencies having a predetermined interrelationship. The interrelationship is determined by the numerical base chosen to represent the unknown frequency. When the selected numerical base is two, a direct binary output is obtained. Logic circuitry is provided for comparing said plurality of known pulse rates with the unknown input pulse rates and successive unknown differential pulse rates generated during preceding comparisons. Output logic circuitry is provided for receiving the output from the comparisons and displaying the output in a binary coded representation.

33 Claims, 6 Drawing Figures

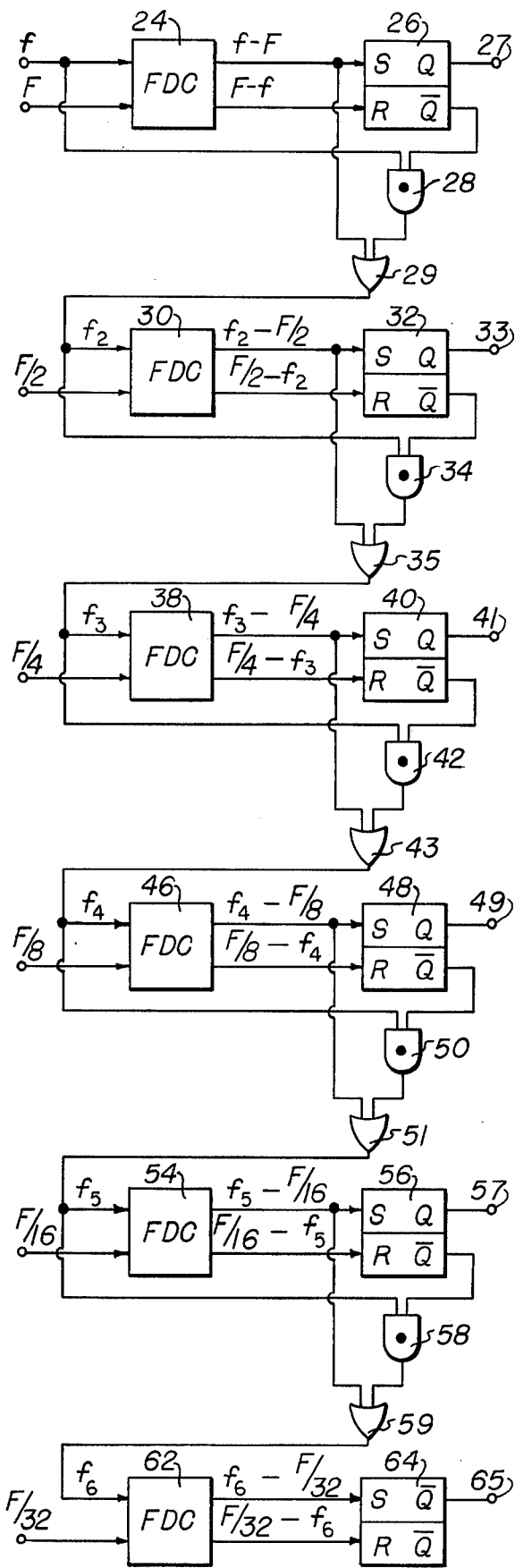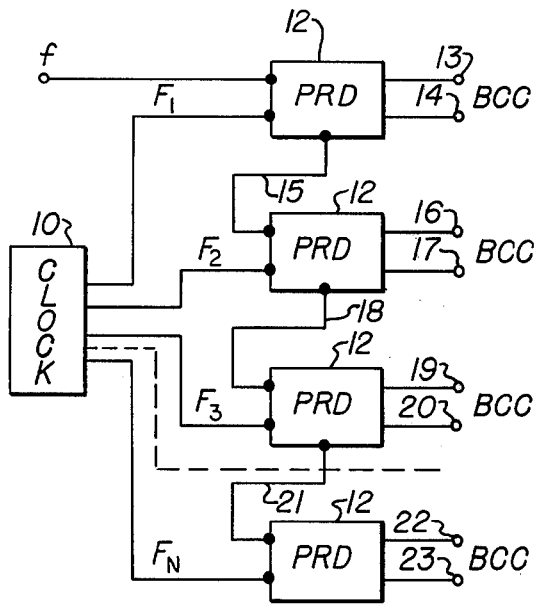
fig.1
fig.2

METHOD AND APPARATUS FOR CONTINUOUS FREQUENCY MEASUREMENT

FIELD OF THE INVENTION

This invention relates generally to frequency measuring methods and apparatus and, more particularly, to frequency measuring methods and apparatus in which an unknown pulse rate is compared against a plurality of known pulse rates to produce a digital output to a preselected resolution and functionally related to the unknown frequency.

BACKGROUND OF THE INVENTION

Frequency measuring devices have wide use in industrial applications, both as part of direct control devices for rotating equipment and as components in various measuring devices. With the wide spread availability of digital processing equipment, it is common to convert many analog signals into digital signals for data processing. In one conventional transformation, analog input is converted to a chain of pulses which are produced at a rate which is functionally related to the analog input. The frequency measuring circuit must then convert this pulse rate into a digital signal for processing.

Prior to digital processing, it was common to measure unknown frequencies where the wave forms were generally sinusoidal. Under these conditions, known frequencies with a sinusoidal wave form were "beat" against the unknown frequencies, wherein a difference frequency would result. The prior art devices of this type are exemplified by U.S. Pat. No. 1,919,803 to Roetken and U.S. Pat. No. 2,131,559 to Granger. A plurality of discrete frequencies in each frequency range was generally beat against the unknown frequency until a second unknown frequency in a preselected frequency range was obtained. A second set of known frequencies was then beat against this second unknown frequency, and so forth. By adding the known frequencies which produced the beat frequencies within the preselected ranges, an approximation of the unknown frequency could be obtained. These prior art devices required manual manipulation to obtain the desired beat frequencies and were not readily adaptable to measuring a continuously varying frequency.

A second technique is illustrated by U.S. Pat. No. 2,576,900 to Brockman, which employed a circuit to count the incoming waves for a known period of time. Brockman illustrates a technique where the counting period is preset by setting a time interval determined by a selected number of waves from the known input, for example $1 \times 10^6$ waves, so that the output would be a direct measurement of the unknown frequency. This technique is illustrated for pulse-type waves by U.S. Pat. No. 3,808,407 to Ratz, where either the known or unknown pulses are used to determine the counting interval. In Ratz, the known and unknown pulses are each counted until one reaches a preselected count and a second counting stage is then actuated until the second count reaches the same preselected total. In this fashion, the second counting stage directly displays the difference in the two pulse rates.

Yet another technique for pulse rate measurement is depicted in U.S. Pat. No. 2,913,664 to Wang, where a known and unknown frequency are combined to provide reset pulses to a scaler, such that an output pulse rate is produced which is functionally related to the unknown frequency and to some integer times a known frequency. Wang teaches that this output pulse rate is then converted to an analog output for visual display purposes. U.S. Pat. No. 2,985,773 to Dobbie provides yet another circuit for producing a difference frequency between a known and unknown pulse rate where the frequency difference appears on one output line if the known pulse rate is greater than the unknown pulse rate and the difference frequency appears on another output line if the unknown pulse rate is greater than the known pulse rate. The specific circuitry taught by Dobbie is composed entirely of NOR gates producing the desired logic. Dobbie does not teach any specific use for the outputs depicted therein, but teaches only a single logical network for obtaining the differential frequency outputs.

It is readily apparent that the above prior art devices are predicated on counting the unknown pulse or wave rate to obtain an indication of the unknown frequency. Thus, the output indication from the circuits is not continuous but only indicates the unknown frequency or pulse rate as the average which occurs during the counting cycle. It would be highly advantageous to provide an output which is a continuous representation of the unknown input frequency or pulse rate and to provide this output in a direct digital form for data processing or for direct conversion into a numerical display through standard binary decoding and display circuitry.

The disadvantages of the prior art are overcome by the present invention, however, and improved methods and apparatus are provided for obtaining a continuous digital output which is functionally related to an unknown input frequency or pulse rate.

SUMMARY OF THE INVENTION

A method is provided for obtaining a continuous logical output which is functionally related to an unknown input frequency or pulse rate by comparing the unknown frequency or pulse rate with a plurality of known frequencies or pulse rates. The relative magnitudes of the known and unknown pulse rates are determined and an output is obtained which is functionally related to such relative magnitudes. A plurality of unknown frequencies may be generated during processing for comparing against other known frequencies or pulse rates and the results of the comparisons displayed to form an such comparisons such that an approximation of the unknown frequency is obtained to a preselected resolution. In one embodiment of the present invention, the known frequencies are generated in a known relationship where $F_n$ equal $F/a^{A-N}$, where F is the highest known pulse rate, a is a preselected numerical base, A is the highest exponent required to present the unknown pulse rate in the numerical base a, and n is the particular exponent in a numerical representation of f in the comparison approximation. Where a is two, a direct binary representation is obtained for the unknown frequency being measured.

A pulse rate measuring apparatus is provided for forming the approximate representation of the unknown frequency or pulse rate to a preselected resolution. A plurality of comparison stages are provided, each of which are provided with a known frequency from conventional clock circuitry wherein the known frequency provided to each stage bears a predetermined relationship with the known frequency provided to the other stages. Logic circuitry is provided for comparing the known and unknown frequencies and for deriving an output indicating the relative magnitude of the known frequency and the unknown frequency which is provided to the particular stage. The logic circuitry also generates a difference frequency for input to a succeeding stage where the unknown frequency provided is greater than the known frequency provided at any particular stage. In a particularly convenient form, a direct binary output is obtained which is a direct binary representation of the unknown input frequency. The logic circuitry which forms the present invention enables the frequency or pulse rate comparisons to be made, a logical output obtained indicating the relative magnitudes, and either the unknown frequency or pulse rate or a difference frequency or pulse rate to be provided to the next stage for comparison with another known frequency.

Accordingly, it is a primary feature of the present invention to provide a direct measurement of an unknown pulse rate which varies directly and continuously with the unknown pulse rate.

It is yet another feature of the present invention to provide a continuous binary coded output which represents an unknown input frequency or pulse rate in a preselected numerical base.

It is yet another feature of the present invention to form an output digital representation of an unknown input pulse rate by a series of successive approximations which occur simultaneously with the progression of the unknown input signal through the pulse rate measurement circuitry.

It is a feature of the present invention to provide a method for obtaining continuous logical output functionally related to an unknown input pulse rate by electrically generating pulses at a plurality of known pulse rates having a predetermined interrelationship and continuously comparing the unknown pulse rate to the plurality of known pulse rates to obtain a binary coded representation of the coefficient in each column of a numerical representation of the unknown pulse rate in a preselected numerical base.

It is yet another feature of the present invention to provide apparatus for measuring an unknown pulse rate which includes a clock means for generating pulses at a plurality of known pulse rates having a predetermined relationship, logic circuitry for continuously comparing the unknown pulse rate to the plurality of known pulse rates and output circuitry for providing a binary coded representation of the coefficient in each column of a numerical representation of the unknown pulse rate in a preselected numerical base.

Other and further objects, advantages and features will become apparent from the following detailed description, wherein reference is made to the figures in the accompanying drawings.

BRIEF DESCRIPTION OF THE DRAWINGS

FIG. 1 is a functional schematic of a frequency measuring device according to the present invention.

FIG. 2 is a more particular functional schematic of a frequency measuring device providing a direct binary output.

DETAILED DESCRIPTION OF THE DRAWINGS

Figures 3, 4:
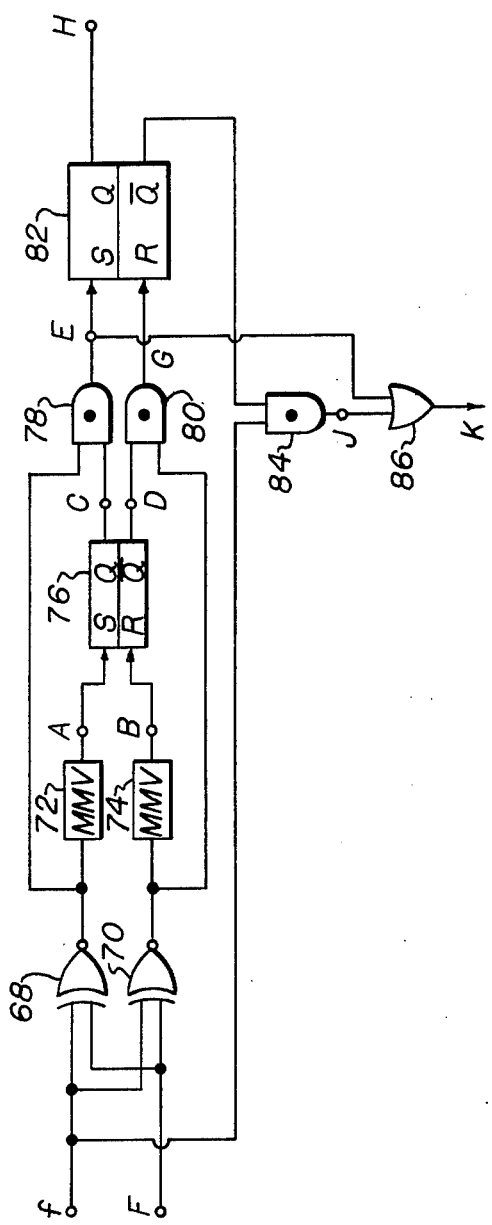
FIG. 3 is a schematic of one embodiment of the frequency difference circuitry depicted in FIG. 2.
FIG. 4 is a timing chart depicting the operation of the circuitry shown in FIG. 3.

Referring now to FIG. 1, there may be seen a schematic functional diagram representing an apparatus for continuously measuring an unknown pulse rate and presenting the pulse rate as a binary coded representation of the coefficient of each column of a numerical representation of the unknown pulse rate in a convenient numerical base. A chain of pulses generated at an unknown pulse rate, f, is presented to a first pulse rate discriminating circuit 12. A clocking circuit provides pulses at known pulse rates and a chain of pulses at a known rate, $F_1$, is also presented to the first pulse rate discriminator 12.

Pulse rate discriminator 12 compares f and $F_1$ and derives several outputs. If $F_1$ is greater than f, output 15 is simply f. If f is greater than $F_1$, output 15 is a chain of pulses at a pulse rate of $(f-F_1)$. Outputs 13 and 14 represent a binary coded coefficient related to the ratio $f/F_1$, as the whole number appearing in the ratio.

Output 15 is presented as a second unknown pulse rate to a second pulse rate discriminator 12, and another known pulse rate $F_2$ is provided. Outputs 16 and 17 represent another binary coded coefficient. Output 18 now is either f if $F_2$ is greater than f, $(f-F_2)$, or $(f-F_1-F_2)$. Pulse rate discriminators 12 are cascaded to obtain a complete binary coded numerical representation of the unknown input pulse rate. As hereinafter discussed, this numerical representation changes almost simultaneously with any change in f since no counting of pulses is required.

It is desirable to provide an output numerical representation of the unknown pulse rate in a digital form which is easily decoded. According to the present invention, the numerical presentation is conveniently obtained by providing that the output from each pulse rate discriminator 12 represent the coefficient of each column of the numerical presentation. In one embodiment of the invention, each coefficient may be conveniently represented in binary. The numerical representation may be in any base and the known frequencies are selected according to the chosen numerical base.

THEORY OF OPERATION

To better understand the operation of the method and apparatus which are the subject of the present invention, and referring again to FIG. 1, the following symbols are defined:

f — unknown pulse rate to be measured.
a — base chosen for numerical representation.
F — known frequency where $aF > f$.
A — highest exponent required to represent F in base "a".
n — particular exponent in a numerical representation of f to base "a".
$C_n$ — coefficient of $a^n$ required to represent f in base a.
$F_n$ — known frequency presented to stage n.
$f_{n+1}$ — unknown frequency presented to state n+1: $f_n$ where $F_n > f_n$; $(f_n - F_n)$ where $f_n > F_n$ In the present invention, $$F_n = F/a^{A-n}$$

so that the ratio $$f_n/F_n = C_n + \text{remainder}$$

is determined at each stage and $C_n$ respresents the corresponding coefficient in the $n^{th}$ column of the numerical representation of the unknown pulse rate in base "a".

$$f_a = C_A C_{A-1} C_{A-2} \ldots C_n \ldots C_o \text{ and}$$

$$f_{10} = C_A a^A + C_{A-1} a^{A-1} + \ldots + C_n a^n \ldots + C_o a^o$$

It is also desirable to further provide $C_n$ as a binary number. This is easily accomplished within each stage by the method and apparatus hereinafter discussed for processing the unknown input pulse rate to obtain a direct binary representation of the pulse rate.

Example 1: a=2. Assume f=1226. In this example, f must be less than 2F and $F=2^A=1024$ where A=10.

| Column n | $F_n$ | $f_n$ | $C_n$ |
|---|---|---|---|
| 10 | 1024 | 1226 | 1 |
| 9 | 512 | 202 | 0 |
| 8 | 256 | 202 | 0 |
| 7 | 128 | 202 | 1 |
| 6 | 64 | 74 | 1 |
| 5 | 32 | 10 | 0 |
| 4 | 16 | 10 | 0 |
| 3 | 8 | 10 | 1 |
| 2 | 4 | 2 | 0 |
| 1 | 2 | 2 | 1 |
| 0 | 1 | 0 | 0 |

It should be noted that F does not have to be a direct power of 2 so long as the required relationship is satisfied between adjacent stages. Thus $f_2 = 10011001010$, and $f_{10} = 1226$.

Example 2: a=4. Assume f=1226.

| Column n | $F_n$ | $f_n$ | $C_n$ |
|---|---|---|---|
| 5 | 1024 | 1226 | 1 |
| 4 | 256 | 202 | 0 |
| 3 | 64 | 202 | 3 |
| 2 | 16 | 10 | 0 |
| 1 | 4 | 10 | 2 |
| 0 | 1 | 2 | 2 |

Accordingly $f_4 = 103022$ which is $f_{10} = 1 \times 4^5 + 0 \times 4^4 + 3 \times 4^3 + 0 \times 4^2 + 2 \times 4^1 + 2 \times 4^0 = 1226$ If it is now desired to present each coefficient in a binary coded form, then each $F_n$ must be stepped up as provided in example 1. Looking at column 3 above for an example, $C_3 = 3$, and A = 3 provides enough columns in base 2, or binary, to represent up to $C_n = 4$. Therefore, a step up must provide known frequencies of:

| $F_n^1$ | $f_n$ | BCC |
|---|---|---|
| (256) | 202 | 0 |
| 128 | 202 | 1 |
| 64 | 74 | 1 |

Binary 011 is readily seen to be $C_n=3$. The highest frequency need not be provided since it is available from the preceding stage and it is enough to know that $f_n$ is greater than 2 $F_n$.

It can be seen that the basic staging is built from binary sub-staging and the basic staging is thereafter cascaded to provide the required resolution. It can also be seen, however, that a direct binary output is the most convenient representation for decoding to a final decimal output or as an input for further digital processing. The total number of pulse rate difference stages for either a binary representation or a binary coded decimal representation can be shown to be about the same up to pulse rates exceeding $1 \times 10^6$ pulses per unit of time.

For low pulse rates, additional stages can be used to improve the precision of measurement. The overall resolution of the binary system is (F maximum/$2^n$), where n is the number of stages. Thus, a six stage system, measuring frequencies of 30 cycles per second (cps), is accurate to about 30/64 cps or about ½ cps. A seven stage device would be accurate to 30/128 cps or about ¼ cps.

Referring now to FIG. 2, there may be seen a simplified schematic in block diagram form of a pulse rate measuring system designed to operate to provide a binary output. The unknown frequency, f, is provided to frequency difference circuit (FDC) 24. A known frequency, F, which is conveniently chosen to be greater than ½ f is also provided to FDC 24. The outputs from FDC 24 are (f−F) and (F−f) and these outputs appear on separate output lines to flip-flop 26. The output (f−F) is provided to the set terminal of flip-flop 26 and the input (F−f) is provided to the reset terminal of flip-flop 26. Thus, an output 27 appears when a first (f−F) pulse arrives at the set terminal. Output 27 will remain so long as consecutive pulses appear at the set terminal. It is readily apparent, therefore, that an output 27 indicates that unknown frequency f is greater than known frequency F. If the signal (f−F) is present, it is also an input to OR gate 29. As hereinafter explained, it will be the only input signal to OR gate 29 and therefore is seen as an output from OR gate 29 to provide a second unknown frequency to stage 2 of the system.

Where the unknown pulse rate, f, is less than the known pulse rate, F, the output from FDC 24 is a pulse rate (F−f) which is an input to the reset terminal of flip-flop 26. With this input, flip-flop 26 is reset and there is no output signal 27, but there is an output signal $\overline{Q}$, indicating the absence of output signal 27. The output from flip-flop 26, $\overline{Q}$, provides an input to AND gate 28 and enables AND gate 28 so that unknown pulses (f) which occur as an input to AND gate 28, enabled by $\overline{Q}$, are seen as the output from AND gate 28. This output is provided to OR gate 29 and is the only input to OR gate 29 since there is no output (f−F) where f is less than F. Therefore, the input to the second stage is just the unknown frequency, f.

As hereinabove discussed, the input to the second stage FDC 30 is either the original unknown frequency, f, or a second unknown frequency, f−F. The known frequency supplied to stage two is ½ the known frequency supplied to stage 1, or F/2. As shown in FIG. 2, this second stage unknown frequency is represented as $f_2$. The output 33 from the second stage will thus indicate whether $f_2$ is greater or lesser than F/2. If $f_2$ is greater than F/2, an output 33 will appear. If $f_2$ is less than F/2, AND gate 34 will be enabled and $f_2$ will pass directly to OR gate 35 to be unknown frequency $f_3$ in the third stage. It will be seen that each unknown input frequency is compared to known frequencies which are related by the relationship $\frac{1}{2}^n$, where n represents the particular cascaded stage from which an output is to be obtained. The operation of the pulse rate measuring device shown in FIG. 2 is illustrated in Table 1 wherein an unknown pulse rate is analyzed by the cascaded six stage network depicted in FIG. 2.

TABLE 1

| S | $F/d^{n-1}$ | $f_n$ | $(f_n\text{-}F/2^{n-1})$ | Output | Binary |
|---|---|---|---|---|---|
| 1 | 32 | 47 | 15 | 27 - Yes | 1 |
| 2 | 16 | 15 | — | 33 - No | 0 |
| 3 | 8 | 15 | 7 | 41 - Yes | 1 |
| 4 | 4 | 7 | 3 | 49 - Yes | 1 |
| 5 | 2 | 3 | 1 | 57 - Yes | 1 |
| 6 | 1 | 1 | 0 | 65 - Yes | 1 |

Binary $101111 = 1 \times 2^5 + 0 \times 2^4 + 1 \times 2^3 + 1 \times 2^2 + 1 \times 2^1 + 1 \times 2^0 = 32 + 0 + 8 + 4 + 2 + 1 = 47$.

It can readily be seen from the above table that the resolution of the system is a direct function of the number of stages provided. It may further be seen that the number of stages required to obtain a resolution to a preselected precision is, thus, a function of the highest pulse rate to be measured. For example, as shown in Example 1 for FIG. 1, discussed hereinabove, a ten stage device would resolve frequencies up to 1,024 pulses per unit of time down to plus or minus one pulse per unit of time.

Referring now to FIG. 3, there is illustrated in schematic form one embodiment of the frequency difference circuits represented in block diagram form in FIG. 2. Associated with FIG. 3 is a pulse timing diagram depicted in FIG. 4, and FIGS. 3 and 4 will be discussed together. In the following discussion, it will be assumed that occurrence of an output will result in a logical 1 appearing at the output terminal. This is done for ease of discussion and it is within the scope of the present invention to have a logical 1 be the normal state and the occurrence of an output be a logical 0 state. If a logical 0 is used to denote an output, the resulting binary number will have to be complimented to obtain the direct binary representation of the unknown frequency.

In FIG. 3 there is shown unknown frequency f and known frequency F supplied as inputs to exclusive OR gates 68 and 70. An output from exclusive OR gate 68 will occur if, and if only, input f is present and the output from exclusive OR gate 70 will be present if, and if only, known input F is present. Thus, no output will be obtained if there is a simultaneous occurrence of the unknown and known pulses. The use of exclusive OR gates 68 and 70 is conveniently done to prevent the occurrence of simultaneous pulses at flip-flop 76 which might result in blocking the action of flip-flop 76. The output from exclusive OR gate 68 is provided to monostable multivibrator (one-shot) 72. The action of one-shot 72 acts to delay the input f so that the output pulse train A is now somewhat later in time than the input pulse train f. The purpose for this delay will be hereinafter explained. Pulse train A thus appears at the set terminal of flip-flop 76. The output from exclusive OR gate 70 is likewise presented to one-shot 74 and also to AND gate 80. The output from one-shot 74 is pulse train B and is supplied to the reset terminal of flip-flop 76.

Assuming first that f is greater than F, it may be seen from FIG. 4 that an output pulse C occurs when an input pulse A arrives at the set terminal of flip-flop 76. Due to the action of one-shot 72, pulse C does not arrive at AND gate 78 simultaneously with pulse f and there is no output pulse E. If a known pulse F now appears at the reset terminal of flip-flop 76, output C is no longer present to enable AND gate 78. If, however, a second unknown pulse f arrives at flip-flop 76 before a known pulse F arrives, output C remains and an unknown pulse will arrive at the enabled AND gate 78 and appear as output E. Thus, an output E occurs only when there occurs one or more unknown pulses f between the first arriving unknown pulse and a subsequent arriving known pulse. Pulse rate E is seen to be the difference between the unknown, f, and known, F, pulse rates.

Conversely, where F is larger than f, no output E will result since there is never an intervening unknown pulse between known pulses. However, there is now an intervening known pulse between unknown pulses so that a known pulse F arrives at enabled AND gate 80. This output appears in FIG. 4 as pulse train G. Output pulses E and G are input to the set and reset terminals, respectively, of flip-flop 82. The occurrence of pulse E at flip-flop 82 will result in an output H. Output H is thus indicative that the unknown pulse rate f is greater than known pulse rate F. So long as this relationship continues, there is a constant output H. As shown in FIG. 4, however, when unknown pulse rate f becomes less than known pulse rate F, there is no output pulse E, and the resulting output pulse G resets flip-flop 82 so that an output H does not occur. The absence of an output pulse H results in an enabling output from flip-flop 82 to be supplied to AND gate 84. AND gate 84 also receives an input from the unknown pulse rate f so that an output J will appear if the known pulse rate F is greater than the unknown pulse rate f. Thus, two outputs appear at OR gate 86. These inputs are mutually exclusive and will be either pulses E, which are the difference (f−F), or the unknown pulse rate f. The resulting output K then becomes the unknown input pulse rate to the next stage.

Figures 5, 6:
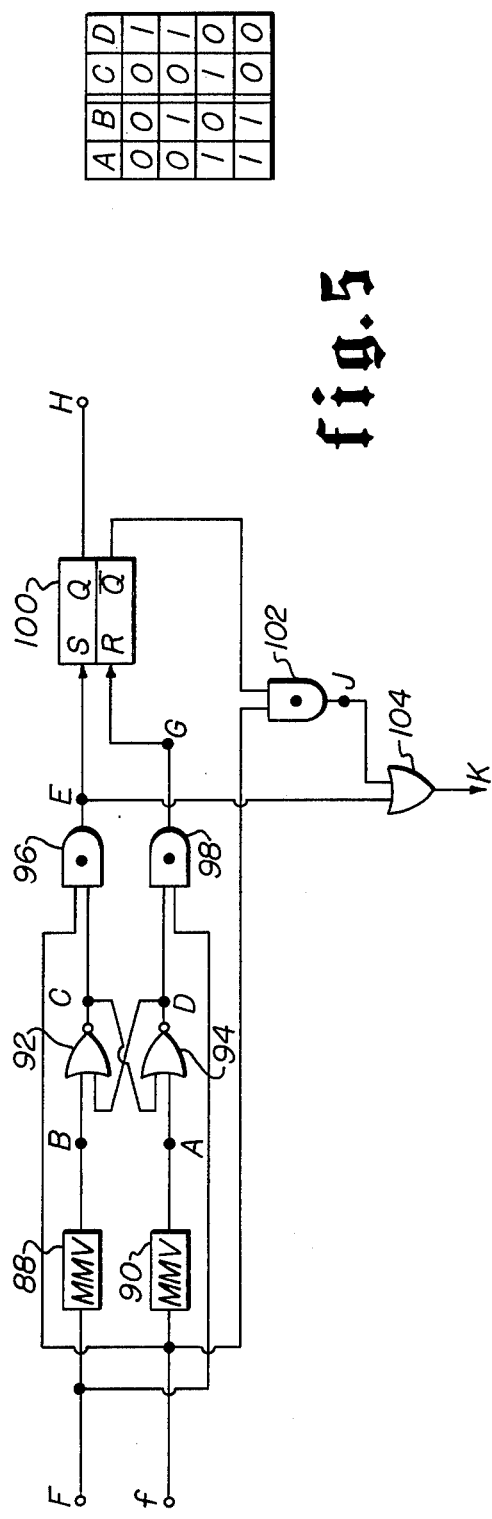
FIG. 5 is another embodiment of the frequency difference circuitry shown in FIG. 2.
FIG. 6 is a timing diagram for the operation of the circuitry depicted in FIG. 5.

Referring now to FIGS. 5 and 6, there may be seen a schematic of an alternate frequency difference circuit and its associated pulse timing diagram. In this embodiment, the exclusive OR gates are not required to prevent blocking of the circuits used to enable the output AND gates 96 and 98. The unknown input pulse rate, f, is provided to one-shot 90 and AND gates 96 and 102. The known frequency F is provided to one-shot 88 and AND gate 98. Again, one-shots 90 and 88 are provided to delay output pulses A and B in time from input pulses f and F, respectively. As shown, NOR gates 92 and 94 are provided in lieu of a conventional flip-flop circuit. An output is obtained from a NOR gate when there is no input to that gate. Accordingly, the interconnection of NOR gates 92 and 94 as shown in FIG. 5 will produce the logical outputs shown in the associated truth table depicted in FIG. 5. When an unknown pulse is present at A, and there is no known pulse F at B, there will be no output from NOR gate 94 and there will be an output from NOR gate 92 at C. Thus, the occurrence of an unknown pulse results in a pulse appearing at C and provided as an input to AND gate 96. The unknown pulse f is also provided to AND gate 96 and will appear as an output E if AND gate 96 is enabled by output C. This will occur when two unknown pulses occur before the occurrence of a known pulse. The second unknown pulse occurs when AND gate 96 is still enabled and an output pulse E will appear, as hereinabove described for FIGS. 3 and 4. Conversely, the occurrence of a second known pulse F before a subsequent pulse f will result in an output G from AND gate 98. Thus, the outputs E and G are the same as described hereinabove for FIGS. 3 and 4 and the outputs H, J and K are developed in the same fashion as hereinabove described. The advantage of the logic circuitry depicted in FIG. 5 is that the occurrence of a simultaneous known and unknown pulse at NOR gates 92 and 94 will not block the action of the circuit but will result in a resetting action so that no output will appear at C and D. Depending on the condition of outputs C and D just prior to the simultaneous arrival of A and B, an output at E or G will be obtained just prior to the reset. Thus, the proper difference pulse rate is obtained as an output.

It will be appreciated from an examination of FIGS. 4 and 6 that the output H will provide a continuous indication of the relative magnitude of the unknown pulse rate f and the known pulse rate F. The greater the difference between the magnitudes of the two pulse rates, the faster the system will respond to the changes since an intervening pulse will occur quicker under such a condition. The occurrence of an intervening known or unknown pulse will set the output accordingly until an opposite intervening pulse occurs to reset the system. It would be desirable, though not necessary, that the known frequency be selected so that the unknown frequency range would be about twice the known pulse rate. It will be appreciated that this is particularly true at higher pulse rates than at lower pulse rates.

As many possible embodiments may be made of this invention without departing from the spirit or scope thereof, it is to be understood that all matters herein set forth in the accompanying drawings are to be interpreted as illustrative and not in any limiting sense.

What is claimed is:

1. A method for deriving from pulses at a known pulse rate a continuous logical output in a preselected base, functionally related to pulses at an unknown pulse rate, comprising the steps of:
   generating pulses at an output pulse rate functionally related to a difference between said pulses at an unknown pulse rate and a multiple of said pulses at a first known pulse rate;
   generating an output functionally related to said difference;
   generating pulses at a second known pulse rate having a predetermined relationship to said pulses at a first known pulse rate;
   repeating the above steps to obtain a plurality of said outputs functionally related to said unknown pulse rate to a preselected precision of measurement, wherein said pulses at an output pulse rate become the next said pulses at an unknown pulse rate, and said pulses at a second known pulse rate become said pulses at a first known pulse rate.

2. The method described in claim 1 wherein said multiple is an integer multiple equal to or greater than zero.

3. The method described in claim 2 wherein said integer multiple is zero when said pulses at an unknown pulse rate occur at a pulse rate less than said pulses at a first known pulse rate.

4. The method described in claim 3 wherein said integer multiple is selected to minimize said difference when said pulses at an unknown pulse rate occur at a pulse rate greater than said pulses at a first known pulse rate.

5. The method described in claim 4 wherein generating said pulses at a second known pulse rate includes:
   generating said pulses at said first known pulse rate; and
   generating at least one set of said pulses at a second known pulse rate having a pulse rate related to said first known pulse rate by the relationship $F_n = f/a^{A-n}$, where:
   "F" is said first known pulse rate;
   "a" is said preselected base for representing said unknown pulse rate;
   "A" is the highest exponent of "a" required to represent said unknown pulse rate; and
   "n" is a particular exponent of "a" in a representation of said unknown pulse rate.

6. A method for deriving from a plurality of known pulse rates having a predetermined interrelationship a continuous logical output in a preselected base functionally related to an unknown pulse rate, comprising the steps of:
   generating pulses at a first known pulse rate;
   comparing said unknown pulse rate to said first known pulse rate;
   deriving a coefficient functionally related to a first ratio of said unknown pulse rate to said first known pulse rate;
   deriving a second unknown pulse rate from the difference between said unknown input pulse rate and the product of said first known pulse rate and said coefficient representing said first ratio;
   transferring said unknown input pulse rate or said second unknown pulse rate where said first ratio is less than one or greater than one, respectively, for comparison with at least one other of said plurality of said known pulse rates; and
   repeating the above steps to obtain a preselected precision of measurement where said transferred pulse rates become said unknown pulse rate and said at least one other of said plurality of said known pulse rates becomes said first known pulse rate.

7. The method of claim 6 wherein generating said plurality of known pulse rates includes:
   generating said pulses at a first known pulse rate; and
   generating at least one second set of pulses having a pulse rate related to said first pulse rate by the relationship $F_n = F/a^{A-n}$ where "F" is said first known pulse rate, "a" is said preselected base for representing said unknown pulse rate, "A" is the highest exponent of "a" required to represent said unknown pulse rate, and "n" is a particular exponent of "a" in a representation of said unknown pulse rate.

8. The method in claim 6, wherein said coefficient in an integer.

9. The method of claim 6 wherein said coefficient is selected so as to minimize said unknown pulse rate.

10. A method for providing a continuous output measurement in a preselected base for unknown input pulse rate, comprising the steps of:
    generating third pulses at a rate equal to the difference between an unknown first pulse rate and a known second pulse rate, continuously deriving a logical output one or zero when said unknown input first pulse rate is greater or lesser than said known second pulse rate, respectively;
    logically gating to transfer pulses at said third pulse rate or said unknown first pulse rate when said logical output is one or zero, respectively; and
    repeating the above steps to obtain a continuous output with a preselected precision where said transferred pulses provide said unknown input first pulse rate and each succeeding known pulse rate is one half the pulse rate of the immediately preceding known pulse rate.

11. Apparatus for measuring an unknown pulse rate, comprising:

clock means for generating pulses at a plurality of known pulse rates having a predetermined relationship;

comparison means for continuously comparing said unknown pulse rate to said plurality of known pulse rates;

logical means for generating from said comparison means a plurality of output pulse rates functionally related to a difference between said unknown pulse rate and said plurality of known pulse rates; and output means for obtaining from said logical means an output in a preselected base functionally related to said unknown pulse rate to a preselected precision.

12. Pulse rate measuring apparatus described in claim 11, wherein said clock means includes:

ocsillator means for generating a first set of pulses having a first known pulse rate;

pulse rate divider means for generating at least one second set of pulses having a pulse rate related to said first known pulse rate by the relationship $F_n = F/a^{A-n}$, where "F" is said first known pulse rate, "a" is said preselected base for representing said unknown pulse rate, "A" is the highest exponent of "a" required to represent said unknown pulse rate, and "n" is an exponent of "a" in a representation of said unknown pulse rate.

13. Pulse rate measuring apparatus described in claim 12, wherein said logical means for generating a plurality of output pulse rates includes:

a plurality of stages for presenting a representation of each coefficient of every term in a numerical representation of said unknown pulse rate in said peselected base;

comparison means in each of said stages for determining the larger of an unknown pulse rate and a known pulse rate;

subtraction means in each of said stages for obtaining pulses at a difference pulse rate functionally related to the difference between said unknown and known pulse rates;

logical means in each of said stages for obtaining an output of the coefficient representing the ratio of said unknown pulse rate to said known pulse rate; and gating means in each of said stages responsive to said comparison means for transferring pulses to a next stage at said unknown pulse rate or at said difference pulse rate where said unknown pulse rate is less or greater than said known pulse rate, respectively.

14. The apparatus of claim 13 wherein said difference pulse rate is equal to the difference between said unknown pulse rate and an integer multiple of said known pulse rate present in said each stage.

15. The apparatus of claim 14 wherein said integer multiple is selected so as to minimize said difference pulse rate when said pulses at an unknown pulse rate occur at a pulse rate greater than said pulses at a known pulse rate.

16. The apparatus of claim 12 wherein said preselected base is identical to a preselected base used to express said output.

17. The apparatus of claim 11 wherein said preselected base is binary.

18. Apparatus for providing a continuous binary output measurement of an unknown input first pulse rate, comprising:

clock means for generating a first known pulse rate and at least one second known pulse rate related to said first known pulse rate by the ratio $\frac{1}{2}^n$;

a plurality of stages each generating a binary output arranged to provide a binary representation of said unknown input first pulse rate to a preselected precision;

subtraction means in each stage for generating pulses at a rate equal to the difference between an unknown stage input pulse rate and a known stage input pulse rate from said clock means;

logical comparison means in each stage for providing a logical one or zero output where said unknown stage input pulse rate is respectively greater or lesser than said known stage input pulse rate; and gating means in each stage responsive to said comparison means for transferring to a subsequent stage said pulses generated by said subtraction means or said unknown stage input pulse rate when said comparision means output is respectively logical one or zero.

19. Apparatus as described in claim 18, wherein said subtraction means includes:

a first flip-flop having a first output when more than one pulse at said unknown stage pulse rate is received during a time between pulses presented at said known stage pulse rate and a second output when more than one pulse at said known stage pulse rate is received at a time between pulses presented at said unknown stage pulse rate, a first AND gate enabled by said first output from said first flip-flop and said pulses at said unknown stage pulse rate to provide output pulses at a rate equal to the difference between said unknown stage pulse rate and said known stage pulse rate, and a second AND gate enabled by said second output from said first flip-flop and said pulses at said known stage pulse rate to provide output pulses at a rate equal to the difference between said known stage pulse rate and said unknown stage pulse rate.

20. Apparatus as described in claim 19, further including a monostable multivibrator interconnected between said input for pulses at said unknown stage pulse rate and said first flip-flop.

21. Apparatus as described in claim 19, further including means for excluding the simultaneous presentation to said first flip-flop of a pulse at said unknown stage pulse rate and a pulse at said known pulse rate.

22. Apparatus as described in claim 19, wherein said logical comparison means includes a second flip-flop having a first output representing a logical one when presented with an output from said first AND gate and a logical zero when presented with the output from said second AND gate and a second output when presented with an output from said second AND gate.

23. Apparatus as described in claim 22, wherein said gating means includes:

a third AND gate enabled by said second output from said second flip-flop to transfer said unknown stage frequency, and an OR gate to transfer pulses presented from said fist AND gate and said third AND gate.

24. The method of claim 1 wherein each of said outputs is functionally related to a coefficient of a different term in a numerical representation of said unknown pulse rate in said preselected base.

25. The method of claim 1 wherein said preselected base is binary.

26. The apparatus of claim 11 wherein said output is functionally related to each coefficient of a numerical representation of said unknown pulse rate in a preselected base.

27. The apparatus of claim 26 wherein said coefficient is an integer.

28. The method of claim 6 wherein each of said outputs is functionally related to a coefficient of a different term in a numerical representation of said unknown pulse rate in said preselected base.

29. The method of claim 10 wherein each of said outputs is functionally related to a coefficient of a different term in a new numerical representation of said unknown pulse rate in said preselected base.

30. The method of claim 6 wherein said preselected base is binary.

31. The method of claim 10 wherein said preselected base is binary.

32. The apparatus of claim 18 wherein said output is functionally related to each coefficient of a numerical representation of said unknown pulse rate in a preselected base.

33. The apparatus of claim 32 wherein said coefficient is an integer.

* * * * *

UNITED STATES PATENT AND TRADEMARK OFFICE
CERTIFICATE OF CORRECTION

PATENT NO. : 4,130,799
DATED : December 19, 1978
INVENTOR(S) : Harvey A. Cherry

It is certified that error appears in the above-identified patent and that said Letters Patent are hereby corrected as shown below:

Col. 2, line 47, "such comparisons" should be deleted, and "output" should be added after "an".

Col. 4, line 60, "a" should be in quotes.

Col. 4, line 62, "state" should be --stage--.

Col. 7, line 1 of Table 1, heading for second column should read --$F/2^{n-1}$-- instead of $F/\underline{d}^{n-1}$.

Col. 9, line 60, claim 5 should refer back to claim 1.

Col. 11, line 32-33, "peselected" should be --preselected--.

Signed and Sealed this

Twenty-fourth Day of April 1979

[SEAL]

Attest:

RUTH C. MASON
Attesting Officer

DONALD W. BANNER
Commissioner of Patents and Trademarks